US009270251B2

(12) United States Patent
Owen et al.

(10) Patent No.: US 9,270,251 B2
(45) Date of Patent: Feb. 23, 2016

(54) CARRIER FOR MOUNTING A PIEZOELECTRIC DEVICE ON A CIRCUIT BOARD AND METHOD FOR MOUNTING A PIEZOELECTRIC DEVICE ON A CIRCUIT BOARD

(71) Applicant: ADAPTIVE METHODS, INC., Rockville, MD (US)

(72) Inventors: Peter Owen, Monrovia, MD (US); Conrad Zeglin, Rockville, MD (US); Barclay Roman, Clifton, VA (US); Mark Meister, Rockville, MD (US)

(73) Assignee: Adaptive Methods, Inc., Rockville, MD (US)

( * ) Notice: Subject to any disclaimer, the term of this patent is extended or adjusted under 35 U.S.C. 154(b) by 271 days.

(21) Appl. No.: 13/833,614

(22) Filed: Mar. 15, 2013

(65) Prior Publication Data

US 2014/0268624 A1 Sep. 18, 2014

(51) Int. Cl.
| | |
|---|---|
| *H05K 5/02* | (2006.01) |
| *H05K 7/18* | (2006.01) |
| *H03H 9/05* | (2006.01) |
| *H05K 3/30* | (2006.01) |
| *H05K 3/32* | (2006.01) |
| *H05K 3/34* | (2006.01) |

(52) U.S. Cl.
CPC ............. *H03H 9/058* (2013.01); *H05K 3/301* (2013.01); *H05K 3/32* (2013.01); *H05K 3/3421* (2013.01); *H05K 2201/10083* (2013.01); *H05K 2201/10424* (2013.01); *H05K 2201/10962* (2013.01); *Y10T 29/4913* (2015.01)

(58) Field of Classification Search
USPC .................. 361/813, 720, 748, 760, 807, 809
See application file for complete search history.

(56) References Cited

U.S. PATENT DOCUMENTS

| | | | | |
|---|---|---|---|---|
| 3,877,064 | A * | 4/1975 | Scheingold et al. | 257/773 |
| 4,330,163 | A * | 5/1982 | Aikens et al. | 439/71 |
| 4,390,220 | A * | 6/1983 | Benasutti | 439/71 |
| 4,641,176 | A * | 2/1987 | Keryhuel et al. | 257/693 |
| 4,918,513 | A * | 4/1990 | Kurose et al. | 439/73 |
| 5,696,422 | A * | 12/1997 | Hanson et al. | 310/344 |
| 6,695,624 | B1 * | 2/2004 | Szu | 439/66 |
| 6,913,468 | B2 * | 7/2005 | Dozier et al. | 439/66 |
| 7,078,799 | B2 * | 7/2006 | Vittu | 257/704 |
| 7,427,822 | B2 * | 9/2008 | Kusai | 310/344 |
| 2002/0043890 | A1 * | 4/2002 | Lu et al. | 310/313 D |
| 2004/0207059 | A1 * | 10/2004 | Hong | 257/678 |
| 2004/0217670 | A1 * | 11/2004 | Ueda et al. | 310/313 R |
| 2006/0150381 | A1 * | 7/2006 | Anzai et al. | 29/25.35 |

* cited by examiner

Primary Examiner — Hung S Bui
(74) Attorney, Agent, or Firm — Dickstein Shapiro LLP

(57) ABSTRACT

A carrier for mounting a piezoelectric device, e.g., a surface acoustic wave (SAW) device, on a circuit board and a method of mounting a piezoelectric device on a circuit board using such a carrier are disclosed. The carrier includes a carrier bottom, a plurality of metal contacts, and a carrier lid attached to the carrier bottom. The carrier bottom has an opening extending partially through the carrier bottom from a top surface thereof and the opening is configured such that when a piezoelectric device to be mounted in the carrier is inserted into the carrier bottom, the piezoelectric device is at least partially recessed within the carrier bottom. The metal contacts include a cantilevered end configured for electrical connection to a piezoelectric device. The carrier lid is configured to retain a piezoelectric device within the carrier bottom and to apply substantially even pressure across a top surface of a piezoelectric device. The method includes mounting the carrier bottom to the circuit board prior to insertion of the piezoelectric device and connection of the carrier lid.

25 Claims, 7 Drawing Sheets

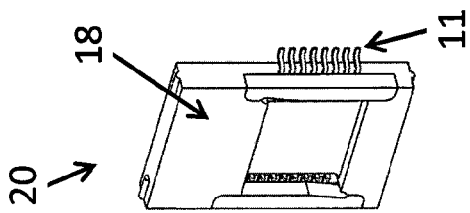
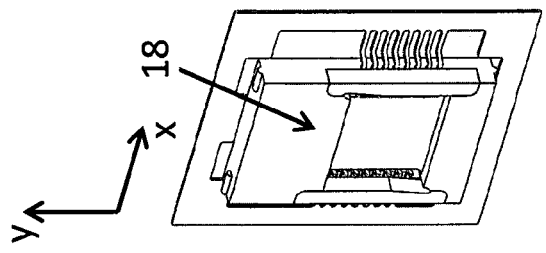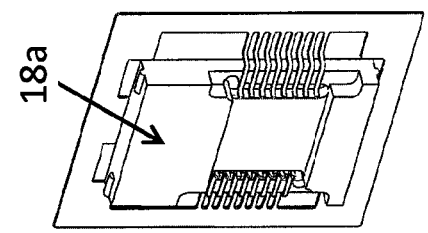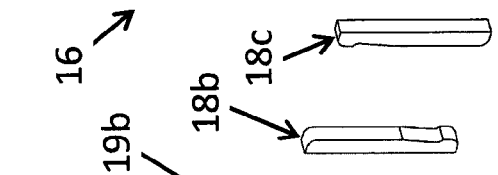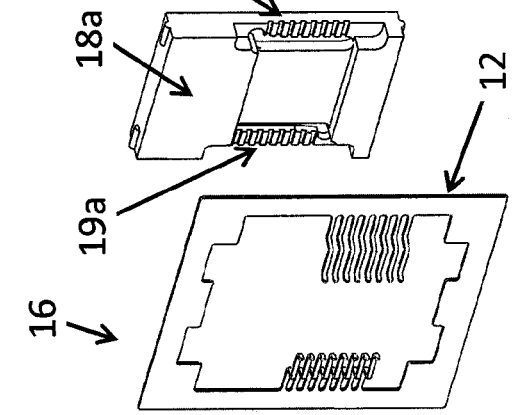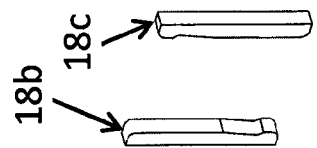
FIG. 2A  FIG. 2B  FIG. 2C  FIG. 2D

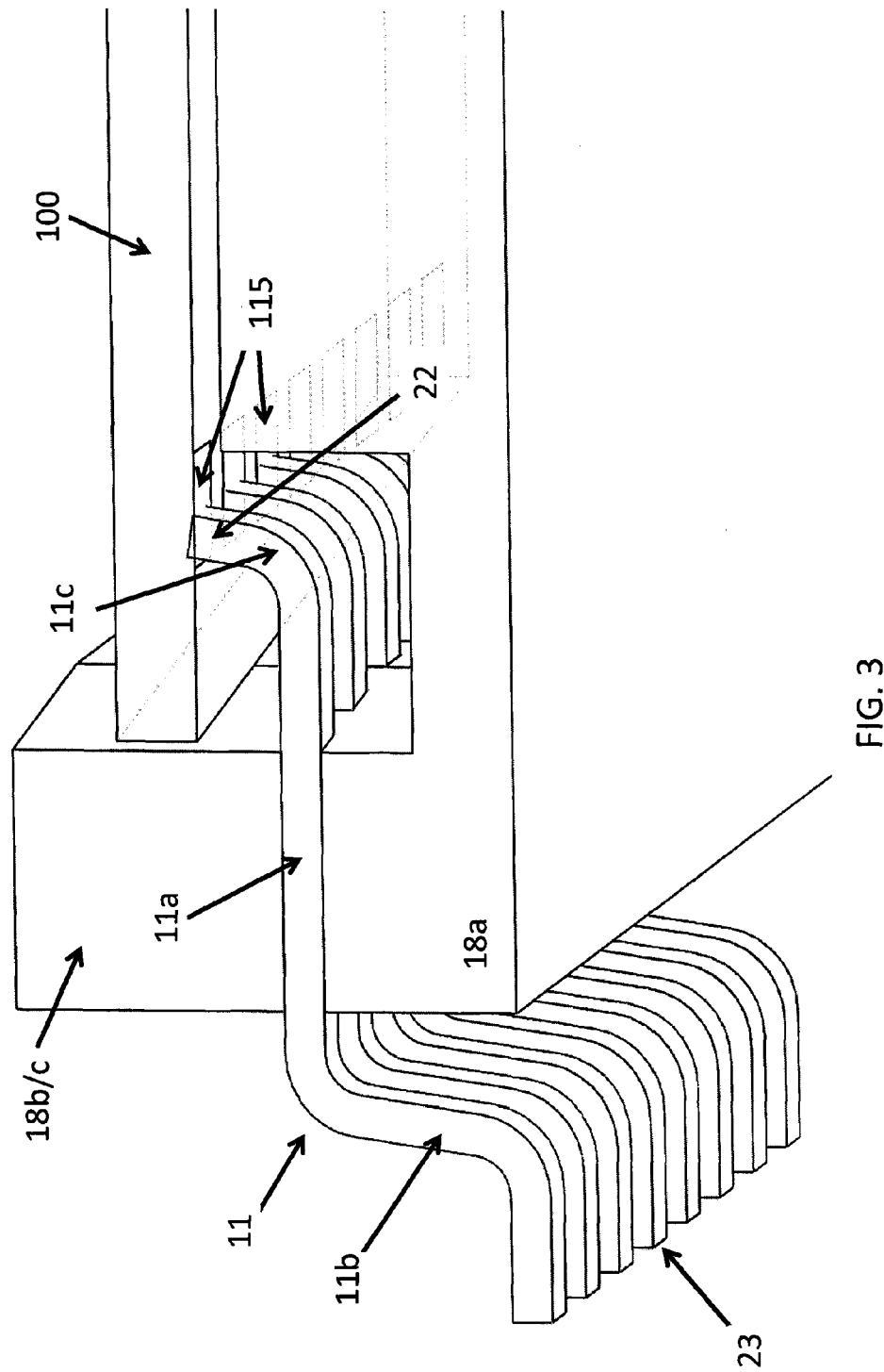

CARRIER FOR MOUNTING A PIEZOELECTRIC DEVICE ON A CIRCUIT BOARD AND METHOD FOR MOUNTING A PIEZOELECTRIC DEVICE ON A CIRCUIT BOARD

FIELD OF THE INVENTION

The invention relates generally to piezoelectric devices, and in particular, to a method of mounting piezoelectric devices on a circuit board and a mounting arrangement for a piezoelectric device.

BACKGROUND OF THE INVENTION

Piezoelectric devices have a wide range of uses in science and industry. One exemplary application of a piezoelectric device is a surface acoustic wave (SAW) device. Such SAW devices may be used, for example, as filters, oscillators and transformers, all of which are devices that are based on the transduction of acoustic waves. SAW devices are generally constructed using a crystalline piezoelectric material which has necessary properties to produce a surface acoustic wave when the device input is stimulated using an electronic signal. Electronic devices including SAW devices therein, will include one or more interdigital transducers (IDTs) to convert the surface acoustic waves to electrical signals (and vice versa), relying on the piezoelectric effect of the crystalline piezoelectric material. One common application of SAW devices is in mobile phones.

SAW devices may also be used as sensors in many areas, including, for example, chemical, optical, thermal, pressure, acceleration, torque and biological. One particular use of SAW devices as a sensor involves the application of a bio-coating to the SAW device to enable the device to detect the presence of biological agents, such as particular viruses and bacteria. SAW technology could be used, for example, to produce an infectious disease detection cartridge, and in one instance this detection cartridge may be low-cost enough to be disposable. A particular challenge in this regard, however, is how to interface, mechanically and electrically, to the sensor itself.

One method of making an electrical connection to a piezoelectric device is wire bonding, e.g., welding. However, when mounting piezoelectric devices, and in particular a bio coated SAW device, to a circuit board, there are several considerations which must be addressed. For example, a bio-coated SAW device is sensitive to heat. While a SAW device, generally, is not heat sensitive, coatings incorporating such biological materials may be damaged by exposure to high temperatures. Wire bonding, which as mentioned is conventionally used for other SAW devices, involves steps that would heat the device to an unacceptable degree in the context of a biosensor. Thus, wire bonding cannot be used for mounting a bio-coated SAW device to the circuit board. Further, piezoelectric devices in general are, by their nature, sensitive to mechanical stress. Stress induced by mechanical contact during mounting must be minimized. Also, a reliable, low-loss connection is needed for the radio frequency (RF) signal input and output from the device. Of course, any successful commercialization requires the mounting method to be low cost as well.

Accordingly, there is a need and desire for a low-cost, reliable method of mounting piezoelectric devices, and in particular a bio-coated SAW device, e.g., a biosensor, on a PC board.

BRIEF DESCRIPTION OF THE DRAWINGS

FIGS. 2A-2D show a method of assembling a bottom carrier portion of a carrier for mounting a SAW device, in accordance with a disclosed embodiment.

FIG. 3 is a cutaway view of a portion of a carrier for mounting a SAW device, in accordance with a disclosed embodiment.

DETAILED DESCRIPTION OF THE INVENTION

Figure 1C:
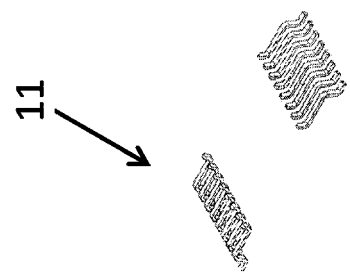
FIGS. 1A-1C show a method of manufacturing a plurality of metal contacts for a carrier for mounting a SAW device, in accordance with a disclosed embodiment.

In the following detailed description, reference is made to the accompanying drawings, which form a part hereof and illustrate specific embodiments that may be practiced. In the drawings, like reference numerals describe substantially similar components throughout the several views. These embodiments are described in sufficient detail to enable those skilled in the art to practice them, and it is to be understood that structural and logical changes may be made. The sequences of steps are not limited to those set forth herein and may be changed or reordered, with the exception of steps necessarily occurring in a certain order.

Figure 5:
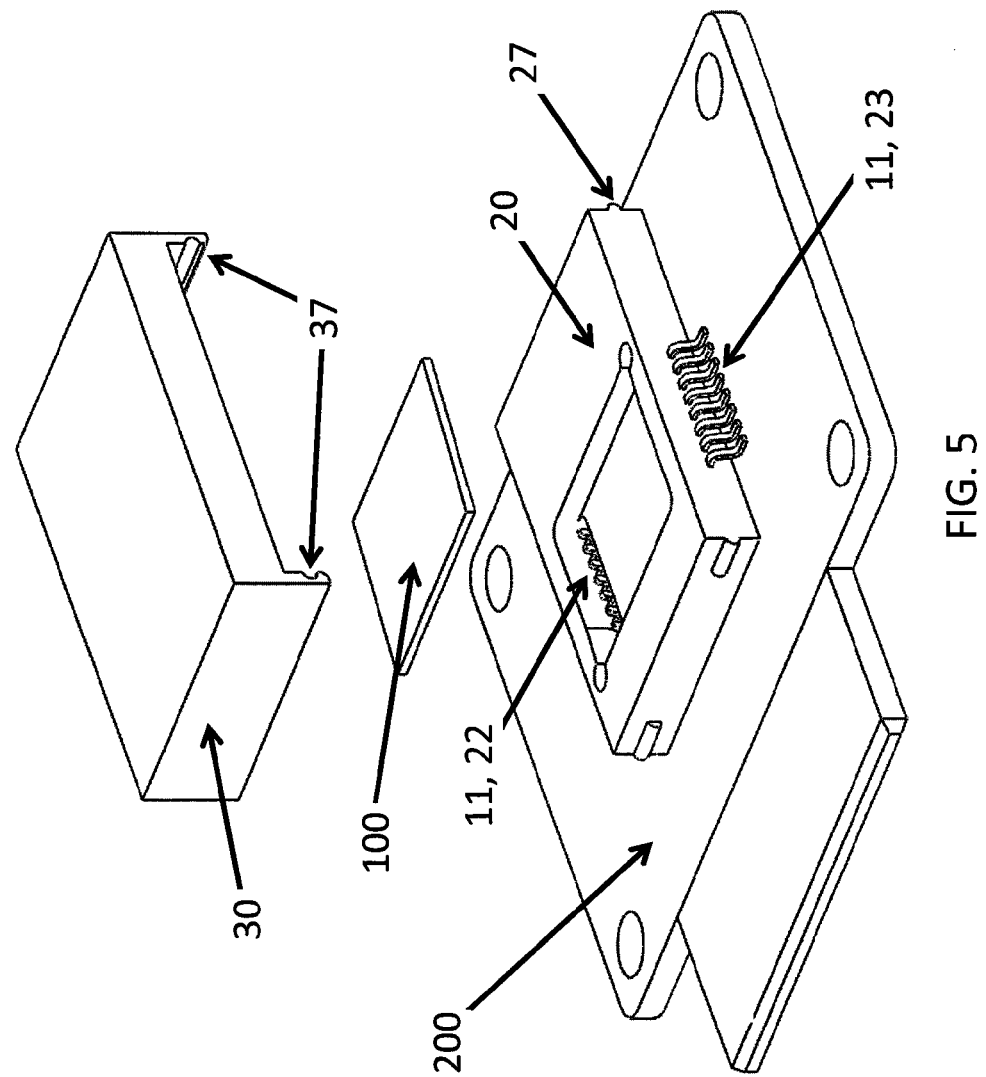
FIG. 5 is an exploded view of a carrier for mounting a SAW device as mounted on a circuit board, in accordance with a disclosed embodiment.
Figure 6:
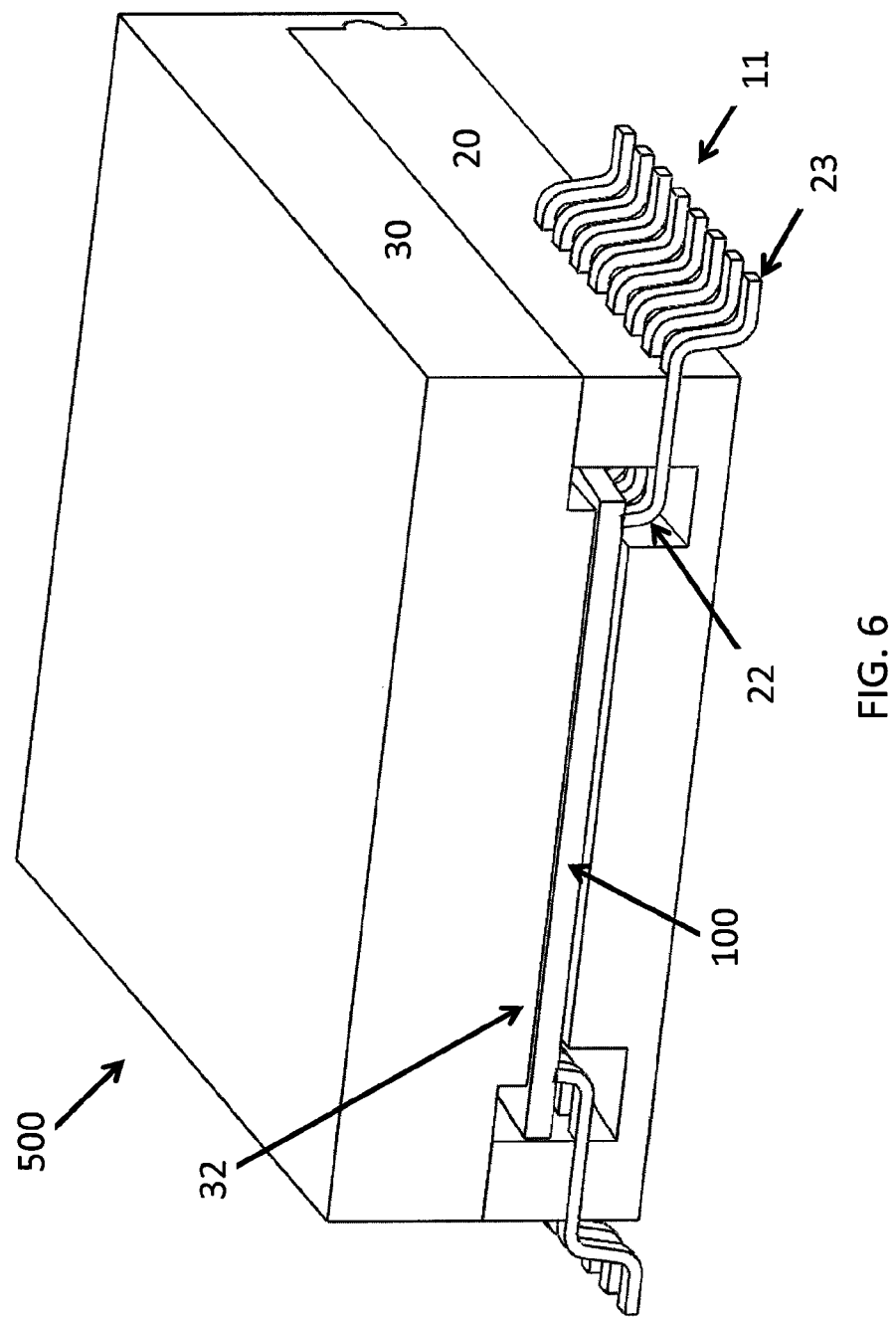
FIG. 6 is a cutaway view of a carrier for mounting a SAW device, in accordance with a disclosed embodiment.

The disclosed embodiments relate to a method of mounting a piezoelectric device on a printed circuit board (PCB). In the example embodiments described herein, a bio-coated SAW device is referenced and shown, however, it should be understood that the method may be used for mounting any type of piezoelectric device on a printed circuit board (PCB). FIG. 6 is a cutaway view of a carrier 500 of an exemplary embodiment including a SAW device 100 mounted therein. As discussed below in more detail, this carrier 500 is mounted on a printed circuit board (PCB) 200 (FIG. 5), providing a spring-loaded connection to, and thus electrical communication with, the SAW device 100.

Figure 1B:
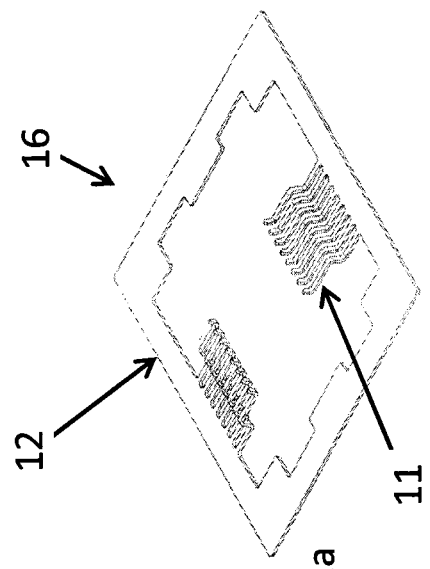
Figure 1A:
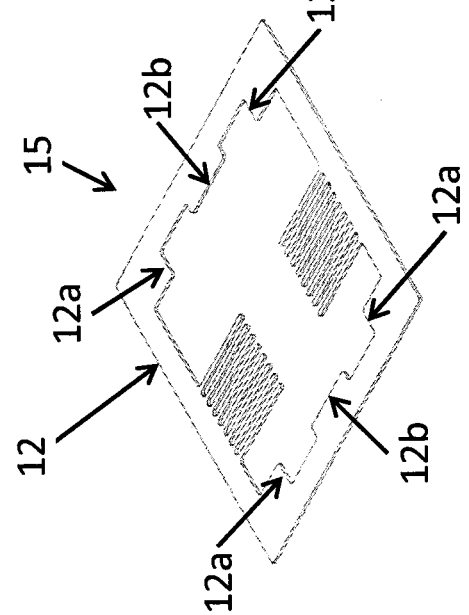

Referring to FIGS. 1A-1C, one method of forming spring-loaded contacts 11 for such a carrier 500 is now described. As seen in FIG. 1A, the contacts 11 (FIG. 1C) may be fabricated from a single sheet of sheet metal, out of which a flat pattern 15 that remains connected by a perimeter frame 12 (e.g., a lead frame) is formed. The initial flat pattern 15 for forming contacts 11 may be cut using any suitable cutting method, such as laser cutting, cutting using a wire Electron Discharge Machine (EDM), or die cutting. A die cutting process is particularly well suited to low-cost mass production. The sheet metal from which frame 12 and flat pattern 15 is cut may be, for example, copper sheet or a copper alloy. The flat pattern 15 is then die-formed, as shown in FIG. 1B, to present formed component 16, including a set of finger-like contacts 11. There is one contact 11 for each electrical pad 115 (FIG. 3) of the SAW device 100. At this point in the process, each contact 11 remains connected by the frame 12. In a later step the frame 12 will be cut off and removed, leaving only the contacts 11, as seen in FIG. 1C.

Referring to FIGS. 2A-2D, an example embodiment in which the formed component 16 is encapsulated in plastic 18 before cutting away the frame 12 is now described. In this instance, the frame 12 maintains the correct orientation and spacing of the contacts 11 until they are encapsulated in plastic 18. The plastic 18 may be formed either by overmolding, using for example injection molding (resulting in FIG. 2C), or fabricated using pre-formed plastic pieces 18a, 18b, 18c, that are attached with adhesive after the frame 12 is dropped into grooves 19a, 19b formed in piece 18a (as shown in FIGS. 2A-2C).

In either case (overmolding or fabrication), the frame 12 may also include additional alignment features 12a/12b (see, FIG. 1A) that help to precisely position the contacts 11 with respect to the electrical pads 115 on the SAW device 100 (see, FIG. 3). The alignment features 12a/12b ensure accurate alignment and electrical connection between the contacts 11 and what may be relatively small electrical pads 115. For example, the features 12a serve to align the frame 12 to plastic 18 in the x-axis (see. FIG. 2C). Likewise, the features 12b serve to align the frame 12 to plastic 18 in the y-axis (see, FIG. 2C). The alignment features could be modified to align the frame 12 to the tooling used for injection molding as well. For example, the alignment features could include a set of holes added to the frame 12, allowing it to slide over a corresponding set of pins protruding from the tooling. This would precisely align the frame 12 to the injection molding tooling.

After the plastic 18 is in place over the contacts 11, the frame 12 is then removed to form the bottom 20 of the carrier 500 (FIG. 6), which includes formed plastic 18 and contacts 11, as shown in FIG. 2D. As seen in FIG. 2D and FIG. 3, the contacts 11 are captured in plastic 18 and are arranged to correspond with and contact each electrical pad 115 of the SAW device 100. As seen in FIG. 3, the shape of each contact 11, generally, includes a central flat portion 11a, which extends through the side of the carrier bottom 20, two angled portions 11b, 11c, angling away from the central flat portion 11a in opposite directions relative to a top plane of the carrier bottom 20, flat end portion 23 for connection to a PCB 200 and cantilevered ends 22 for contacting the electrical pads 115 of the SAW device 100.

When a SAW device 100 is inserted into the carrier bottom 20, the assembly functions as shown in the cutaway shown in FIG. 3. The contacts 11 protrude through the carrier bottom 20, and cantilevered ends 22 provide a spring-loaded connection to each electrical pad 115 of the SAW device 100. The opposite end 23 of the contacts 11 may be formed in the same manner as the leads of a standard surface mounted IC. These ends 23 of the contacts 11 can be soldered to a matching footprint on a printed circuit board (PCB) 200, in a conventional manner, as shown in FIG. 5. In order to avoid damage to the SAW device 100 during soldering, the carrier bottom 20 is soldered to the PCB 200 before the SAW device 100 is placed into the assembly.

Figure 4:
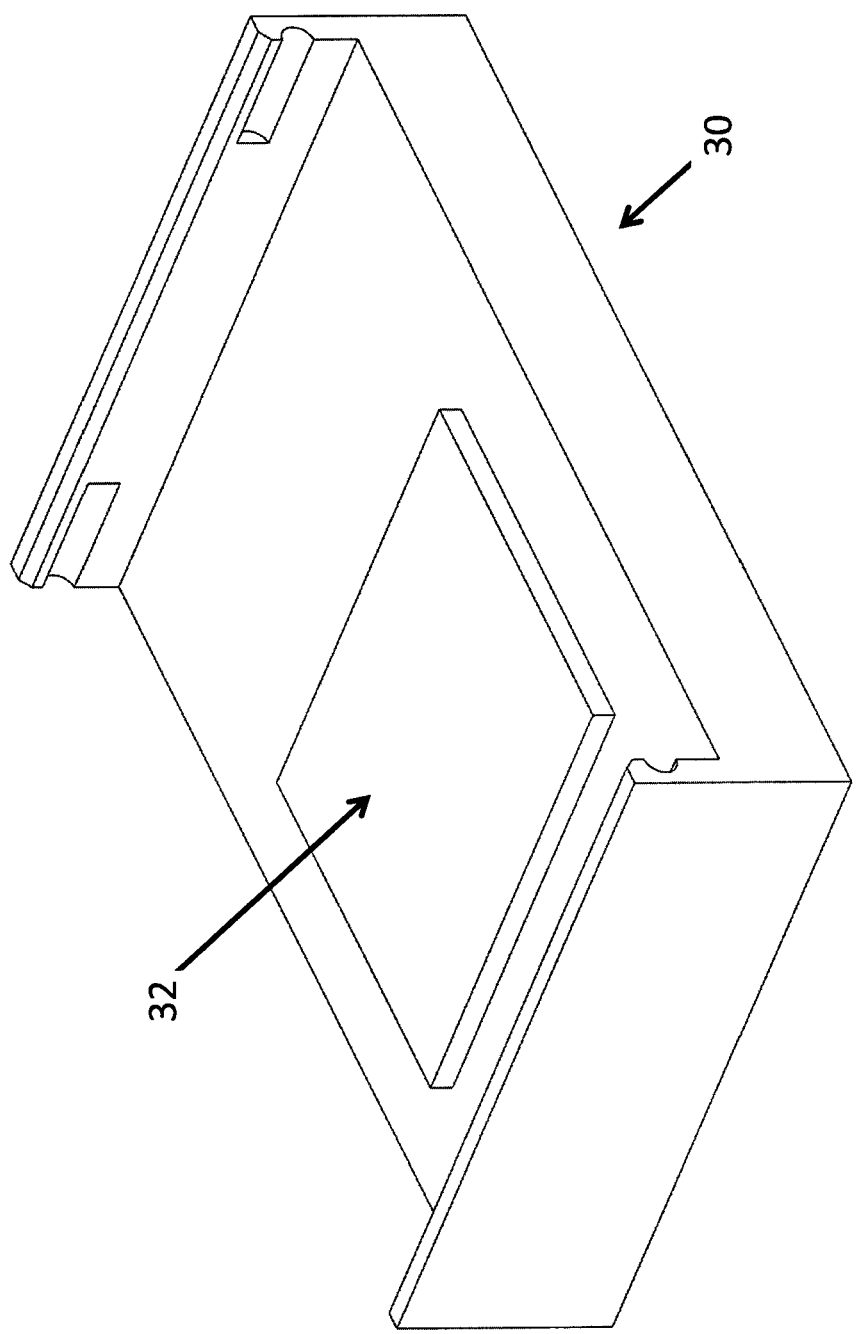
FIG. 4 shows a carrier lid portion of a carrier for mounting a SAW device, in accordance with a disclosed embodiment.
Figure 7:
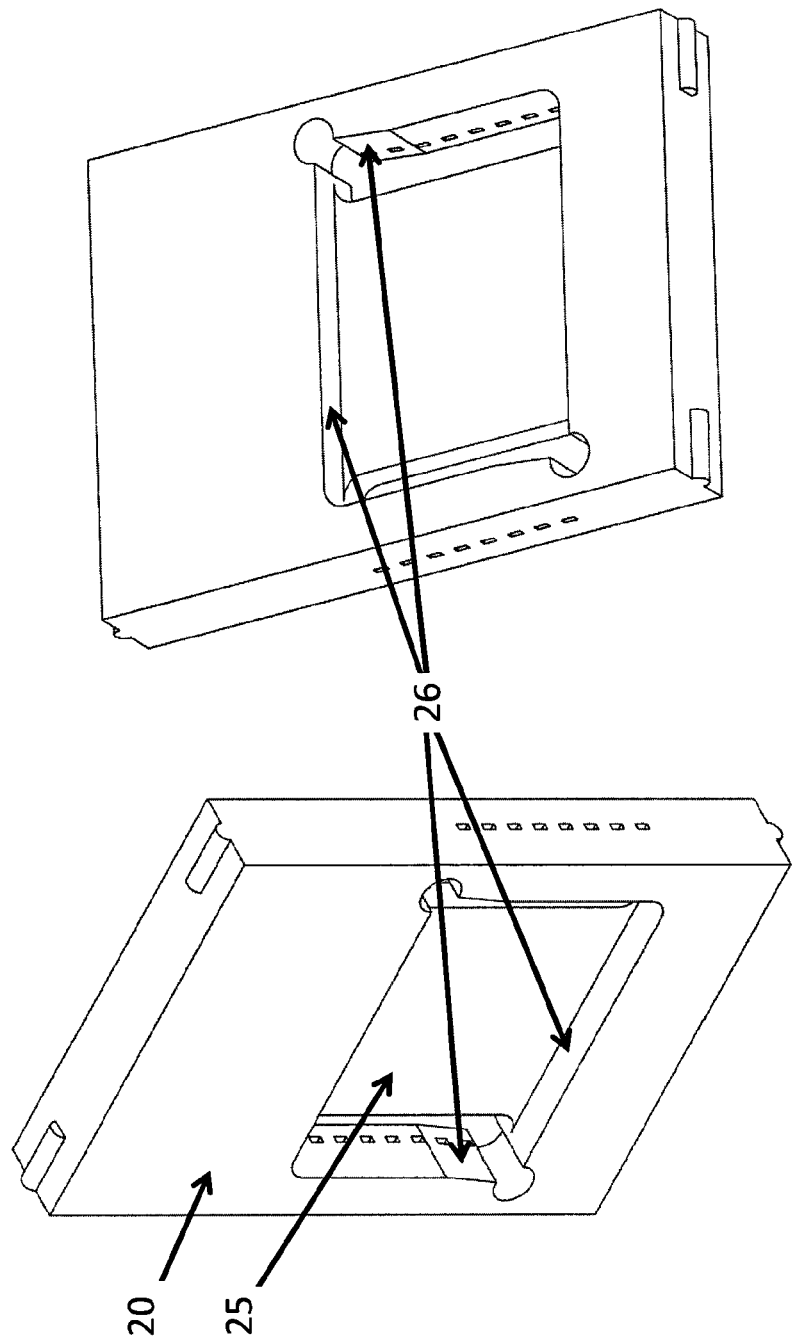
FIG. 7 is an annotated view of a bottom carrier portion of a carrier for mounting a SAW device, in accordance with a disclosed embodiment.

To complete the carrier 500, a lid 30 (FIGS. 4-6) retains the SAW device 100 within the carrier bottom 20. Lid 30 applies appropriate pressure to cause the cantilevered ends 22 of the contacts 11 to become spring-loaded and pressed against the electrical pads 115 of the SAW device 100. When the SAW device 100 is inserted into carrier bottom 20, it must be installed such that the lid 30 will not damage the device upon installation. This can be done as shown in FIG. 7, by making the indicated area 25 deeper than the thickness of the SAW device 100. The tips of contacts 11 must also be located below the top surface of the plastic 18. This configuration results in the SAW device 100 registering against the indicated areas 26, such that a bottom surface of the SAW device 100 is below a top plane of the carrier bottom 20 (see, FIGS. 3, 6). In other words, when the SAW device 100 is inserted into the carrier bottom 20, it is at least partially recessed such that the SAW device 100 cannot slide sideways prior to installation of the lid 30. In this way, the SAW device 100 will be appropriately positioned when the lid 30 is installed, such that the lid 30 will not damage the SAW device 100 upon assembly. Pressure is applied evenly across the SAW device 100 with a raised area 32, or boss, formed on the underside of the lid 30. The shape of boss 32 substantially corresponds to the shape of the SAW device 100. In particular, the boss 32 is a rectangular raised portion that is circumscribed around the electrical pads 115 on the SAW device 100. The entire assembly comes together as shown in the cutaway view of FIG. 6. The boss 32 on the underside of the lid 30 allows the lid 30 to seat against a top plane of the carrier bottom 20 while still pressing the SAW device 100 down to the proper depth so that the contacts 11 are flexed to an appropriate degree to maintain steady and reliable contact with the electrical pads 115 of the SAW device 100. The lid 30 may be attached to the carrier bottom 20 using integral molded snap hooks, each formed of a socket portion 37 formed in lid 30 and a corresponding hook portion 27 formed on carrier bottom 20 (or vice versa), as seen in FIG. 5. Alternatively, lid 30 may be attached using adhesive or screws to connect lid 30 to carrier bottom 20.

Since the final assembly of the SAW device 100 into the carrier 500 (see FIG. 6) is performed after the carrier bottom 20 is already attached to the circuit board 200, the problem of heat sensitivity for bio-coated SAW devices may be avoided. The sensitivity to bending is mitigated with the low force of the spring leads 22 of contacts 11 in conjunction with the fact that the leads 22 are pressing on the SAW device 100 in an area supported by the boss 32 on the underside of the lid 30 (see, e.g., FIG. 6). This support from the lid minimizes flexural forces in the SAW. Finally, since the design can be created with a combination of die-stamping and plastic injection molding, which are processes developed for and ideally suited to low-cost, reliable mass production, the carrier device 500 can be manufactured reliably and at a low-cost.

The foregoing discussion merely illustrates the principles of the invention. Although the invention may be used to particular advantage in the context of medical device design and manufacture, those skilled in the art will be able to incorporate the invention into other piezoelectric device applications. It will thus be appreciated that those skilled in the art will be able to devise numerous alternative arrangements that, while not shown or described herein, embody the principles of the invention and thus are within its spirit and scope.

What is claimed as new and desired to be protected by Letters Patent of the United States is:

1. A carrier for mounting a piezoelectric crystal device on a circuit board, the carrier comprising:
   a carrier bottom including an opening extending partially through the carrier bottom from a top surface thereof, the opening being configured such that when a piezoelectric crystal device to be mounted in the carrier is inserted into the carrier bottom, the piezoelectric crystal device is at least partially recessed within the carrier bottom;
   a plurality of metal contacts, mounted on the carrier bottom, wherein each of the plurality of metal contacts is configured such that a first end of each contact is arranged outside of the carrier for electrical connection to a circuit board on which the carrier is to be mounted and a second end is arranged inside of the carrier for electrical connection to the piezoelectric crystal device; and a carrier lid attached to the carrier bottom, wherein the carrier lid is configured to retain a piezoelectric crystal device within the carrier bottom and to apply substantially even pressure across an entire top surface of the piezoelectric crystal device, wherein the plurality of metal contacts are arranged such that the second end of each of the plurality of metal contacts is in alignment with a corresponding one of a plurality of electrical pads of the piezoelectric crystal device, the electrical pads are on a bottom surface of the piezoelectric crystal device, and the bottom surface of the piezoelectric crystal device is on an opposite side of the piezoelectric crystal device from the top surface of the piezoelectric crystal device, and wherein at least one of the second ends of the metal contacts terminates in an end tip, the end tip configured to point towards the piezoelectric crystal device when the piezoelectric crystal device to be mounted in the carrier is inserted into the carrier bottom.

2. The carrier of claim 1, wherein each of the plurality of metal contacts is configured such that the second end of the contact is cantilevered.

3. The carrier of claim 2, wherein the carrier lid includes a raised area on a side thereof facing the inside of the carrier, the raised area configured to contact the piezoelectric crystal device when mounted, wherein a size and location of the raised area substantially corresponds to a size and location of the piezoelectric crystal device to be mounted.

4. The carrier of claim 3, wherein a thickness of the raised area on the carrier lid is configured to cause the cantilevered end of each of the plurality of metal contacts to be spring-loaded.

5. The carrier of claim 1, wherein the plurality of metal contacts protrudes through sides of the carrier bottom.

6. The carrier of claim 1, wherein each of the plurality of metal contacts is further configured to be spring-loaded when a piezoelectric crystal device is mounted within the carrier and the carrier lid is attached to the carrier bottom.

7. The carrier of claim 1, wherein the carrier lid is attached to the carrier bottom by one of integral molded snap hooks, adhesive or screws.

8. The carrier of claim 1, wherein piezoelectric crystal device is a bio-coated surface acoustic wave (SAW) device.

9. The carrier of claim 1, wherein the piezoelectric crystal device to be mounted in the carrier comprises at least one electrical pad having a first pad surface configured to face the at least one end tip when the piezoelectric crystal device to be mounted in the carrier is inserted into the carrier bottom, and the at least one end tip is configured to penetrate the first pad surface when the piezoelectric crystal device is mounted.

10. A method of mounting a piezoelectric crystal device on a circuit board, the method comprising:
   forming a carrier bottom;
   forming a plurality of metal contacts mounted on the carrier bottom;
   connecting the carrier bottom to a circuit board via a first end of each of the plurality of metal contacts, wherein the first end of each metal contact protrudes outside the carrier bottom;
   inserting a piezoelectric crystal device into the carrier bottom, wherein the carrier bottom includes an opening extending partially through the carrier bottom from a top surface thereof, the opening being configured such that when the piezoelectric crystal device is inserted into the carrier bottom, the piezoelectric crystal device is at least partially recessed within the carrier bottom, and wherein the plurality of metal contacts are arranged such that a second end of each of the plurality of metal contacts is arranged inside of the carrier bottom to be in alignment with and configured for electrical connection to a corresponding one of a plurality of electrical pads of the piezoelectric crystal device; and
   connecting a carrier lid to the carrier bottom, wherein the carrier lid retains the piezoelectric crystal device within the carrier bottom and applies substantially even pressure across an entire top surface of the piezoelectric crystal device,
   wherein at least one of the second ends of the metal contacts terminates in an end tip, the end tip configured to point towards the piezoelectric crystal device when the piezoelectric crystal device to be mounted in the carrier is inserted into the carrier bottom.

11. The method of claim 10, wherein the second end of each of the plurality of metal contacts is cantilevered.

12. The method of claim 11, wherein connecting the carrier lid to the carrier bottom further causes the cantilevered ends of the plurality of metal contacts to be spring-loaded.

13. The method of claim 11, wherein the carrier lid includes a raised area on a side thereof facing the inside of the carrier, and wherein a thickness of the raised area on the carrier lid is configured to cause the cantilevered ends of the plurality of metal contacts to be spring-loaded.

14. The method of claim 10, wherein forming the carrier bottom comprises injection molding plastic around the plurality of metal contacts.

15. The method of claim 10, wherein forming the carrier bottom comprises pre-forming a plurality of plastic pieces, placing the plurality of metal contacts placed between the plurality of plastic pieces, and connecting the plurality of plastic pieces together.

16. The method of claim 15, wherein the plurality of plastic pieces are connected together using adhesive.

17. The method of claim 10, wherein forming the plurality of metal contacts comprises:
   forming a flat cutout, the flat cutout comprising a plurality of flat contact portions attached to a frame;
   die forming the plurality of flat contact portions into the plurality of metal contacts; and
   separating the plurality of metal contacts from the frame.

18. The method of claim 17, wherein separating the plurality of metal contacts from the frame occurs prior to forming the carrier bottom.

19. The method of claim 17, wherein separating the plurality of metal contacts from the frame occurs after forming the carrier bottom.

20. The method of claim 17, wherein forming the flat cutout comprises one of die cutting, using a wire electron discharge machine or laser cutting.

21. The method of claim 17, wherein the flat cutout further comprises alignment features for accurate alignment of the plurality of metal contacts with the corresponding plurality of electrical contacts of the piezoelectric crystal device.

22. The method of claim 10, wherein attaching the carrier lid to the carrier bottom utilizes one of integral molded snap hooks, adhesive, or screws.

23. The method of claim 10, wherein the carrier lid includes a raised area on a side thereof facing the inside of the carrier, the raised area configured to contact the piezoelectric crystal device when mounted, and wherein a size and location of the raised area substantially corresponds to a size and location of the piezoelectric crystal device to be mounted.

24. The method of claim 10, wherein piezoelectric crystal device is a bio-coated surface acoustic wave (SAW) device.

25. The method of claim 10, further comprising penetrating a first pad surface of at least one of the plurality of electrical pads with at least one end tip of the second ends of the metal contacts.

* * * * *